United States Patent

Nagai

[11] Patent Number: 6,074,948
[45] Date of Patent: Jun. 13, 2000

[54] METHOD FOR MANUFACTURING THIN SEMICONDUCTOR DEVICE

[75] Inventor: Keiji Nagai, Tokyo, Japan

[73] Assignee: NEC Corporation, Tokyo, Japan

[21] Appl. No.: 09/252,978

[22] Filed: Feb. 19, 1999

[30] Foreign Application Priority Data

Feb. 19, 1998 [JP] Japan .................................. 10-037224

[51] Int. Cl.⁷ .................................................. H01L 21/302
[52] U.S. Cl. .............................. 438/689; 438/694; 217/17
[58] Field of Search ..................................... 438/689, 694; 216/17; 257/692, 693, 698; 156/345; 205/157

[56] References Cited

U.S. PATENT DOCUMENTS

| | | | |
|---|---|---|---|
| 3,914,050 | 10/1975 | Dost et al. ................................ | 355/133 |
| 5,041,896 | 8/1991 | Temple et al. ............................. | 357/50 |
| 5,640,047 | 6/1997 | Nakashima ................................ | 257/738 |
| 5,801,441 | 9/1998 | DiStefano et al. ....................... | 257/696 |

FOREIGN PATENT DOCUMENTS 8-195402  7/1996  Japan .

*Primary Examiner*—Benjamin L. Utech
*Assistant Examiner*—Kin-Chan Chen
*Attorney, Agent, or Firm*—McGinn & Gibb, P.C.

[57] ABSTRACT

In a method for manufacturing a semiconductor device, a semiconductor wafer having a front surface with semiconductor elements and a back surface with no semiconductor elements is prepared, and the back surface of the semiconductor wafer is etched to form a first wall on the back surface of the semiconductor wafer in its periphery and a second wall of a grid configuration constructed by two stripes on the back surface of said semiconductor wafer within the first wall. The second wall is connected to the first wall.

8 Claims, 14 Drawing Sheets

METHOD FOR MANUFACTURING THIN SEMICONDUCTOR DEVICE

BACKGROUND OF THE INVENTION

1. Field of the Invention

The present invention relates to a method for manufacturing a semiconductor device such as a thin semiconductor device having a plated heat sink (PHS) metal layer for dissipating the heat from a back surface of the device.

2. Description of the Related Art

Generally, a semiconductor wafer is constructed by a plurality of pellet (chip) portions and pellet dividing portions therebetween. The pellet dividing portions are also called etching cut portions.

As semiconductor devices have been developed, the thickness of the semiconductor devices has been reduced to suppress the increase in temperature of the semiconductor devices. Also, in order to cool the semiconductor devices, PHS metal layers are formed on the back surface of the semiconductor devices.

In a prior art method for manufacturing a thin semiconductor device having a PHS metal layer on the back surface thereof, the front surface of a semiconductor wafer is adhered to a transparent supporting plate by an adhesive element. Then, the back surface of the semiconductor wafer is polished and made thinner. Then, the back surface of the semiconductor wafer is etched, so that via holes and etching cut portions are formed within the semiconductor wafer. In this case, a plurality of pellets (chips) are surrounded by the pellet cut portions. Then, a plating path metal layer is deposited on the entire surface by an evaporating process. Then, a photoresist pattern layer is formed in the etching cut portion of the semiconductor wafer on the plating path metal layer. Then, a PHS metal layer is electroplated on the plating path layer by applying a negative voltage to the plating path metal layer and a positive voltage to an electrolytic bath (not shown). Finally, the pellets are separated from each other by performing a dicing process or the like upon the supporting plate in the etching cut portions. In this state, each of the pellets is associated with each piece of the supporting plate. Then, the adhesive element Is removed by using organic solvent or the like, so that each of the pellets is separated from each piece of the supporting plate. Thus, the pellets each having a plated heat sink and via holes are completed. This will be explained later in detail.

In the above-mentioned prior art method, when the pellets are separated from the supporting plate, contamination may be introduced Into the pellets by the residual adhesive elements, or marks or cracks may be generated in the pellets. This decreases the manufacturing yield.

Also, the supporting plate adhering step and the supporting plate separating step decrease the productivity.

Further, when the semiconductor wafer is adhered to the supporting plate, cracks are easily created in the semiconductor wafer, since the semiconductor wafer is generally warped more or less.

Additionally, since the photoresist pattern layer is formed on the back surface of the warped semiconductor wafer, the alignment accuracy of the via holes is deteriorated. As a result, it is impossible to form more-fined via holes

SUMMARY OF THE INVENTION

It is an object of the present invention to increase the manufacturing yield of a thin semiconductor device.

Another object is to increase the productivity of a thin semiconductor device.

A further object of the present invention is to improve the alignment accuracy of via holes of a thin semiconductor device.

According to the present invention, in a method for manufacturing a semiconductor device, a semiconductor wafer having a front surface with semiconductor elements and a back surface with no semiconductor elements is prepared, and the back surface of the semiconductor wafer is etched to form a first wall on the back surface of the semiconductor wafer in its periphery and a second wall of a grid configuration constructed by two stripes on the back surface of said semiconductor wafer within the first wall. The second wall is connected to the first wall.

Also, a plating path layer is deposited on the back surface of the semiconductor wafer except for the second wall, and a plated heat sink metal layer is electroplated on the plating path layer except for the second wall by applying a voltage to the plating path layer.

Further, via holes are formed in the semiconductor wafer on the front surface, and surface electrodes are formed within the via holes of the semiconductor wafer. In this case, the semiconductor wafer etching step etches the semiconductor wafer to expose the surface electrodes from the back surface of the semiconductor wafer, and the plated heat sink electroplating step applies the voltage to the surface electrodes.

Otherwise, surface electrodes are formed on the front surface of the semiconductor wafer before the semiconductor wafer is etched, and via holes are formed in the semiconductor wafer on the back surface to expose the surface electrodes before the plating path layer is deposited. The plated heat sink electroplating step applies the voltage to the surface electrodes.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, a prior art method for manufacturing a semiconductor device will be explained with reference to FIGS. 1A, 1B, 1C, 1D, 2 and 3.

Figure 1A:
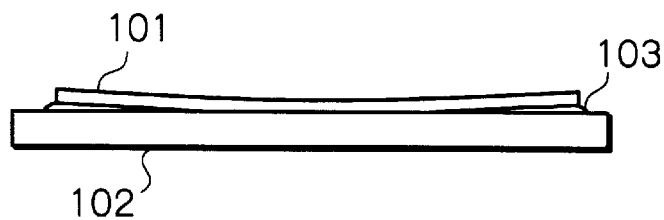
FIGS. 1A, 1B, 1C and 1D are cross-sectional views for explaining a prior art method for manufacturing a semiconductor device.

First, referring to FIG. 1A, the front face 101a of a semiconductor wafer 101, in which semiconductor elements such as transistors are formed, is adhered to a transparent supporting plate 102 made of glass or the like by an adhesive element 103 made of wax or the like. Then, the back face 101b of the semiconductor wafer 101 is polished, so that the semiconductor wafer 101 is made thinner.

Figure 2:
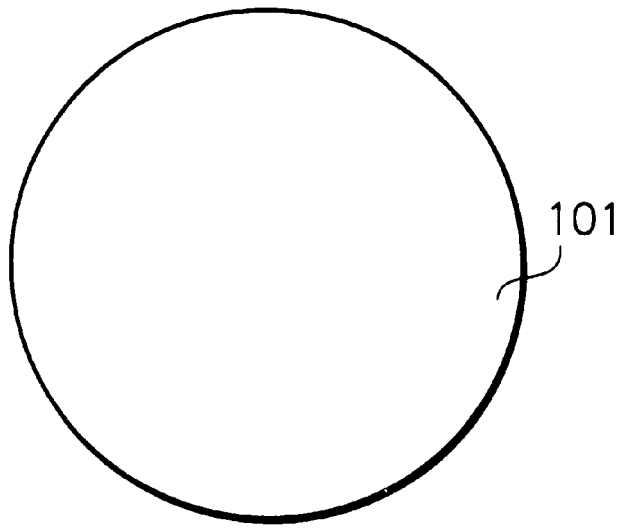
FIG. 2 is a plan view of the semiconductor wafer of FIG. 1A.
Figure 3:
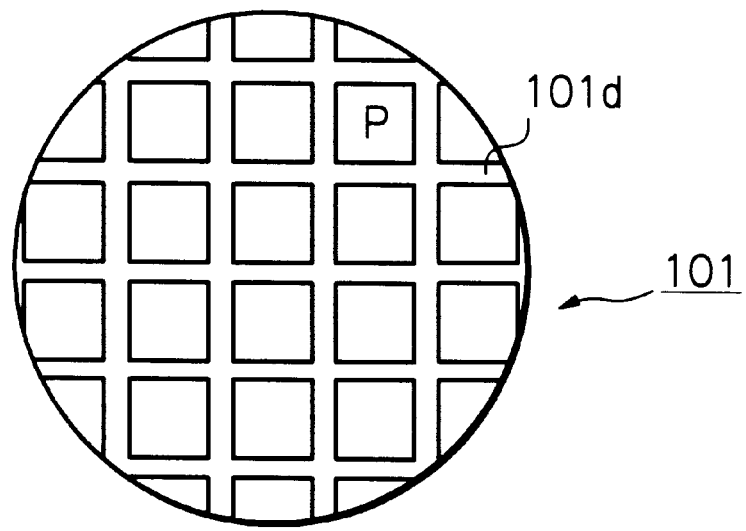
FIG. 3 is a plan view of the semiconductor wafer of FIG. 1B.

Note that the semiconductor wafer 101 is entirely illustrated in FIG. 2.

Figure 1B:
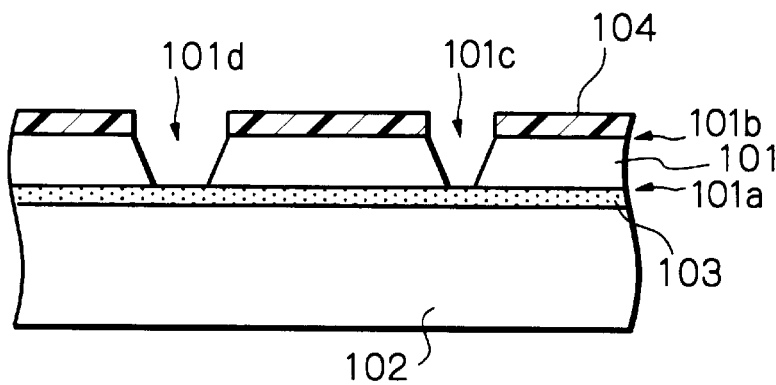

Next, referring to FIG. 1B, a photoresist pattern layer 104 is formed on the back surface 101b of the semiconductor wafer 101 by a photolithography process. Then, the semiconductor wafer 101 is etched by using the photoresist pattern layer 104 as a mask. As a result, via holes 101c and an etching cut portion (or pellet dividing portion) 101d are formed within the semiconductor wafer 101.

Then, the photoresist pattern layer 104 is removed. In this case, the semiconductor wafer 101 is entirely illustrated in FIG. 3, where a plurality of pellets (chips) P are surrounded by the pellet cut portion 101d.

Figure 1C:
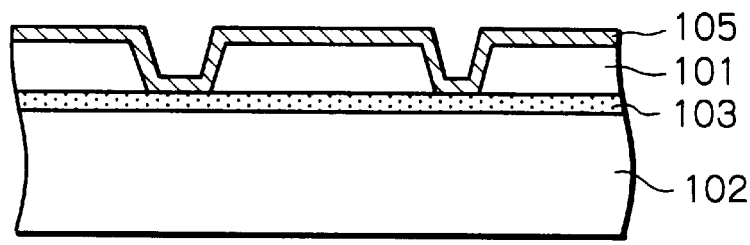

Next, referring to FIG. 1C, a plating path metal layer 105 made of Au/Ti is deposited on the entire surface by an evaporating process.

Figure 1D:
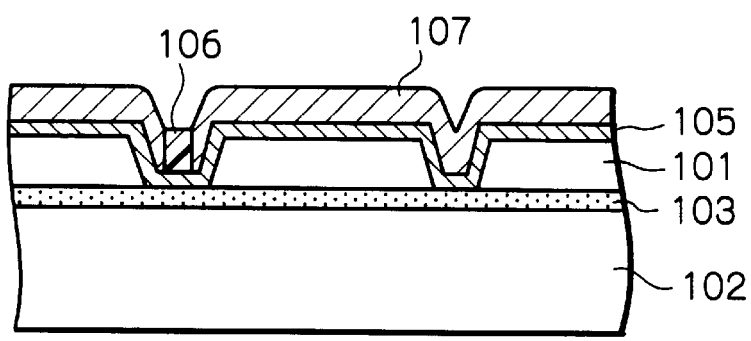

Next, referring to FIG. 1D, a photoresist pattern layer 106 is formed in the etching cut portion 101d of the semiconductor wafer 101 on the plating path metal layer 105. Then, a PHS metal layer 107 made of Au is electroplated on the plating path layer 105 by applying a negative voltage to the plating path metal layer 105 and a positive voltage to an electrolytic bath (not shown) of Au. Then, the photoresist pattern layer 106 is removed.

Finally, the pellets P are separated from each other by performing a dicing process or the like upon the supporting plate 102 in the etching cut portion 101d. In this state, each of the pellets P is associated with each piece of the supporting plate 102. Then, the adhesive element 103 is removed by using organic solvent or the like, so that each of the pellets P is separated from each piece of the supporting plate 102. Thus, the pellets P each having a plated heat sink and via holes are completed.

In the method as illustrated in FIGS. 1A, 1B, 1C, 1D, 2 and 3, when the pellets P are separated from the supporting plate 102, contamination may be introduced into the pellets P by the residual adhesive element 103, or marks or cracks may be generated in the pellets P. This decreases the manufacturing yield.

Also, the supporting plate adhering step and the supporting plate separating step decrease the productivity.

Further, when the semiconductor wafer 101 is adhered to the supporting plate 103, cracks are easily created in the semiconductor wafer 101, since the semiconductor wafer 101 is generally warped more or less.

Additionally, since the photoresist pattern layer 104 is formed on the back surface 101b of the warped semiconductor wafer 101, the alignment accuracy of the via holes 101c is deteriorated. As a result, it is impossible to form more-fined via holes 101a.

A first embodiment of the method for manufacturing a semiconductor device is explained next with reference to FIGS. 4A, 4B, 5A, 5B, 6A, 6B, 7, 8A, 8B, 9 and 10. FIGS. 4B, 5B, 6B and 8B are cross-sectional views taken along the lines IV—IV, V—V, VI—VI and VIII—VIII of FIGS. 4A, 5A 6A and 8A, respectively.

Figure 4A:
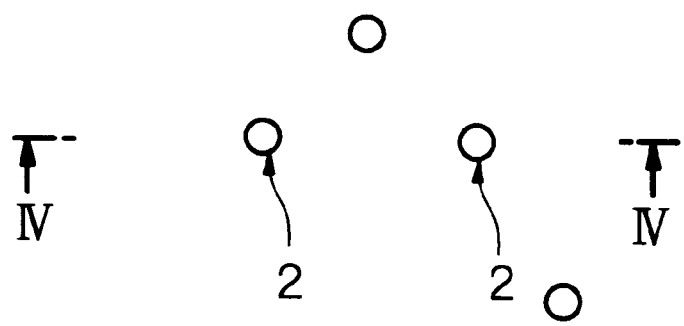
FIGS. 4A, 5A, 6A and 8A are plan views for explaining a first embodiment of the method for manufacturing a semiconductor device according to the present invention.
Figure 4B:
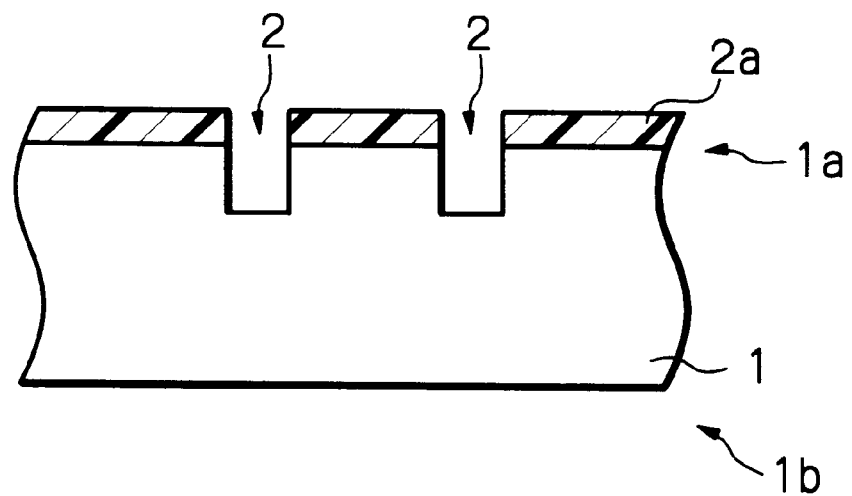
FIGS. 4B, 5B, 6B and 8B are cross-sectional views taken along the lines IV—IV, V—V, VI—VI and VI—VI of FIG. 4A, 5A, 6A and 8A, respectively.

First, referring to FIGS. 4A and 4B, a 4-inch diameter, about 600 μm thick semiconductor wafer 1 made of GaAs is prepared. In this case, transistors are formed on a front surface 1a of the semiconductor wafer 1 in advance, while no transistors are formed on a back surface 1b of the semiconductor wafer 1. Then, a photoresist pattern layer 2a is formed on the front surface 1a of the semiconductor wafer 1 by a photolithography process. Then, holes 2 with a depth of about 30 μm are formed etching the semiconductor wafer 1 by using the photoresist pattern layer 2a as a mask. Then, the photoresist pattern layer 2a is removed.

Figure 5A:
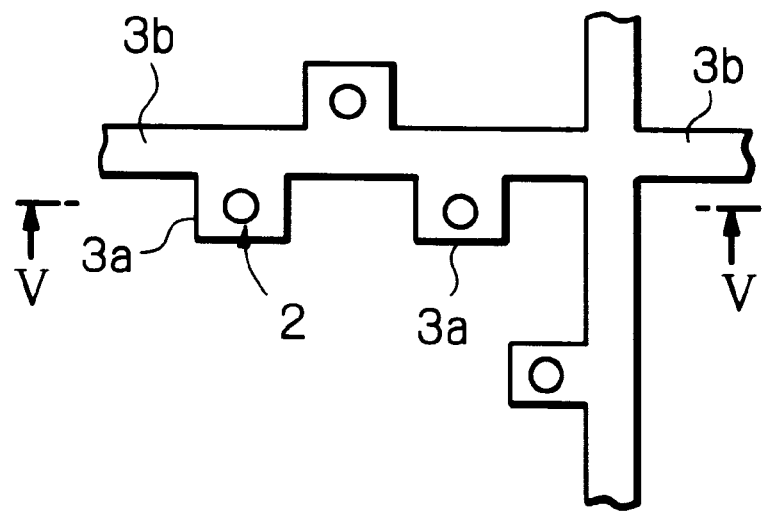
Figure 5B:
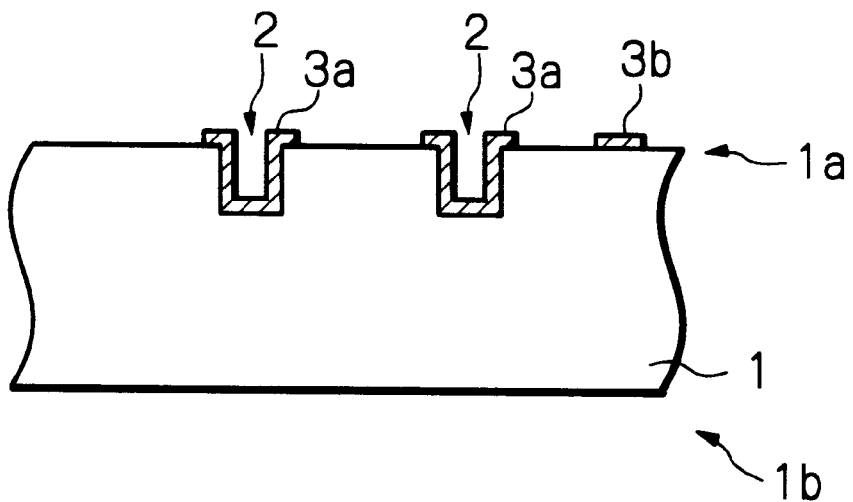

Next, referring to FIGS. 5A and 5B, a metal layer 3 (not shown) is deposited by an evaporating process or a sputtering process, and then, the metal layer is patterned by a photolithography and etching process. As a result, surface electrodes 3a are formed withing the via holes 2, and a connection electrode 3b for connecting the surface electrodes 3a is formed on the front surface 1a of the semiconductor wafer 1.

Figure 6A:
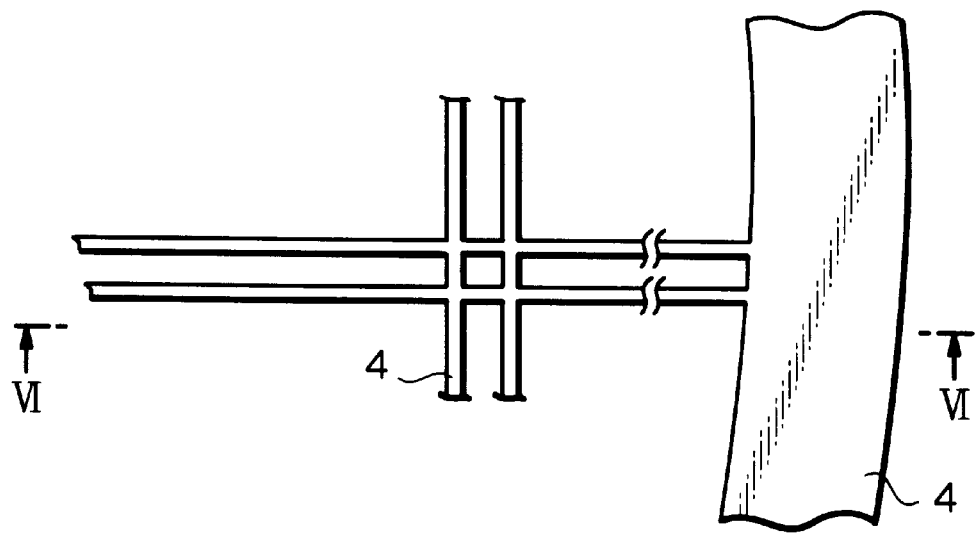
Figure 6B:
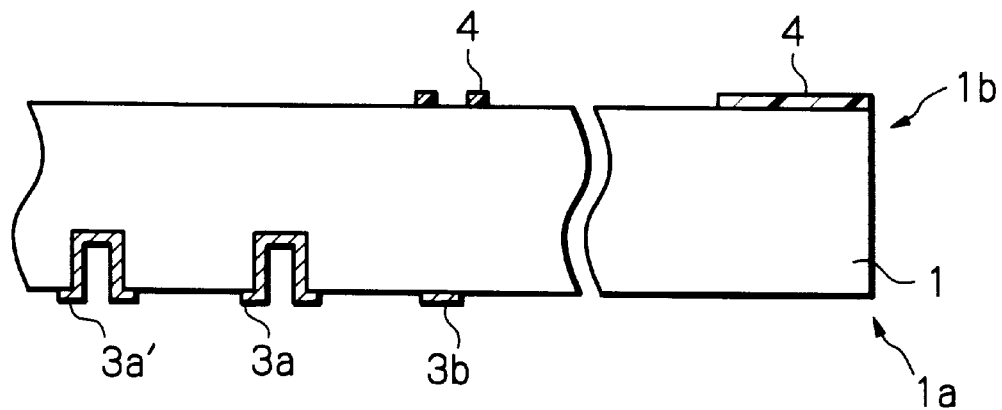
Figure 7:
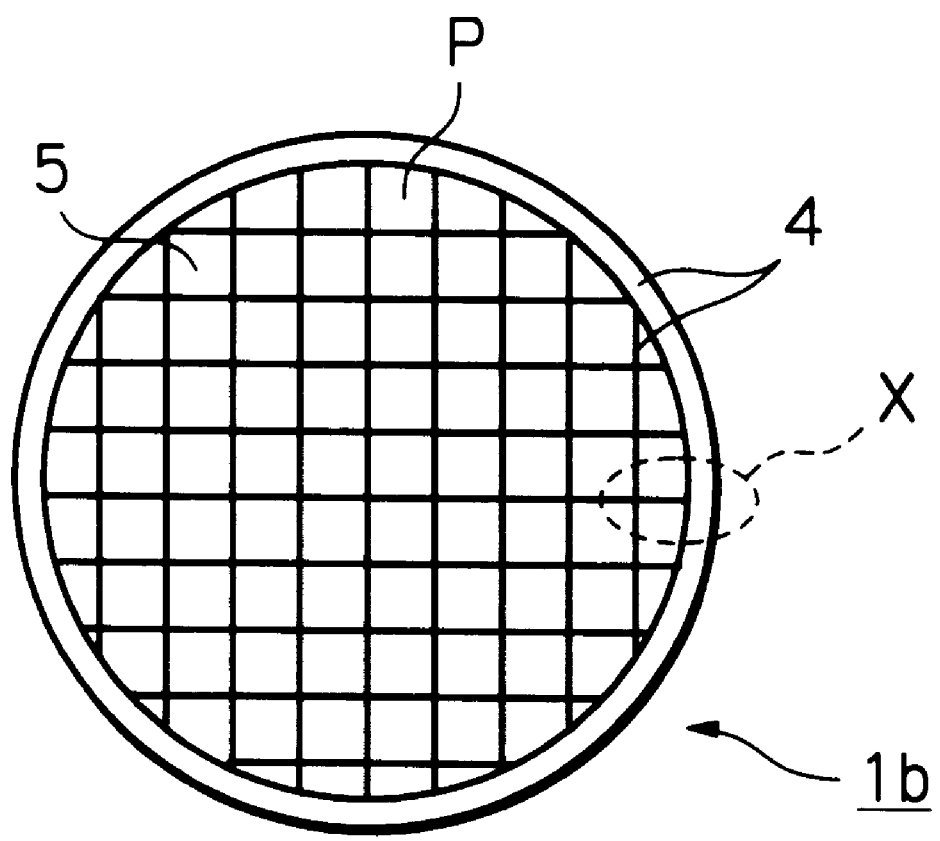
FIG. 7 is a plan view of the back surface of semiconductor wafer of FIGS. 6A and 6B.

Next, referring to FIGS. 6A and 6B, after the semiconductor wafer 1 is reversed, a photoresist pattern layer 4 is formed on the back surface 1b of the semiconductor wafer 1 by using a photolithography process. In this case, as illustrated in FIG. 7 which illustrates the entire back surface 1b of the semiconductor wafer 1, the photoresist pattern layer 4 is constructed by a first portion having a width of about 5 mm around the semiconductor wafer 1, and a second portion formed by two stripes each having a width of about 50 μm. The two stripes sandwich one etching cut portion. That is, the second portion is of a grid configuration that is constructed by uniformly spaced perpendicular and horizontal lines. Note that FIGS. 6A and 6B correspond to an area indicated by X in FIG. 7.

Figure 8A:
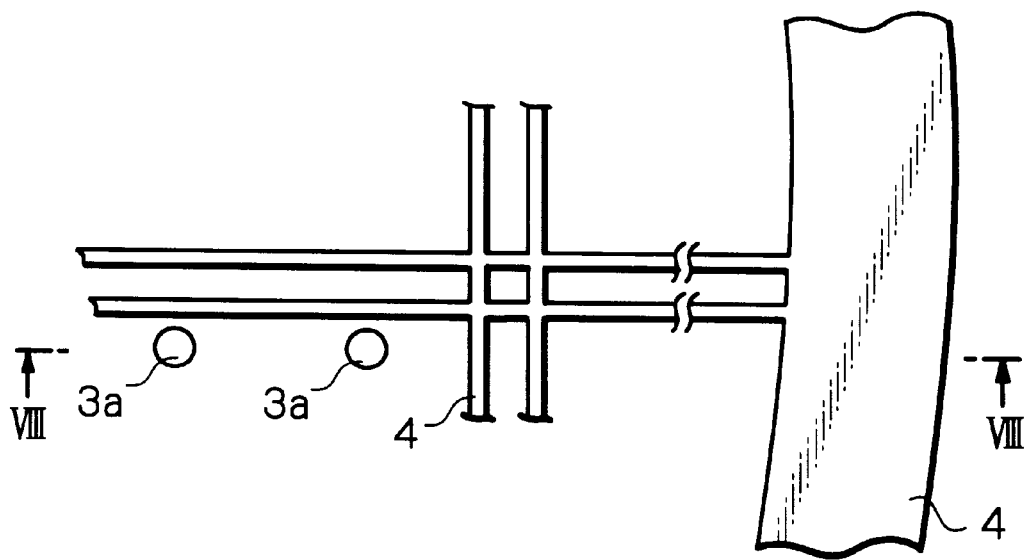
Figure 8B:
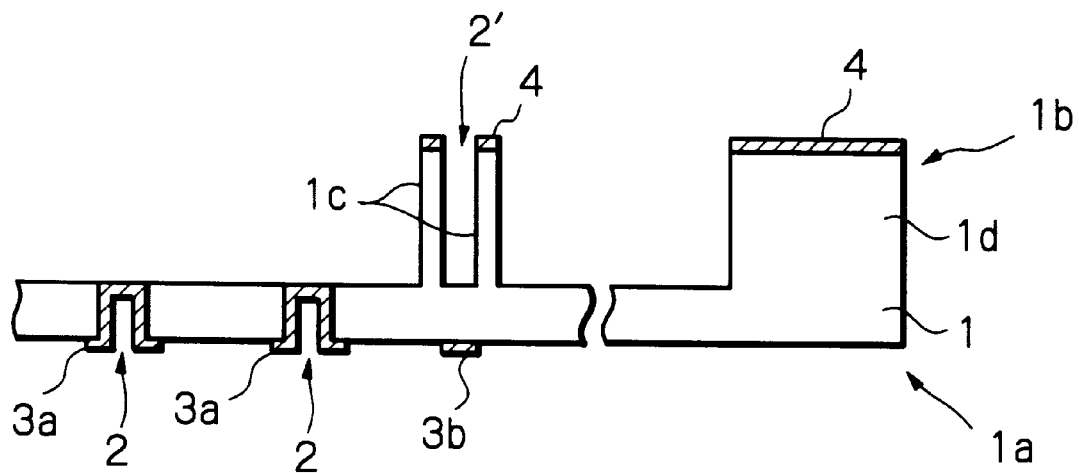

Next, referring to FIGS. 8A and 8B, the semiconductor wafer 1 is etched by a dry etching process using the photoresist pattern layer 4 as a mask, so that the surface electrodes 3a are exposed from the back surface 1b of the semiconductor wafer 1. Thus, the semiconductor wafer 1 is made thin except for the etching cut portions and the periphery portion. That is, walls 1c having a through hole 2' therebetween remain on both sides of the etching cut portions, and a wall 1d remains in the periphery portion of the semiconductor wafer 1. Then, the photoresist pattern layer 4 is removed; however, the photoresist pattern layer 4 can be left.

Figure 9:
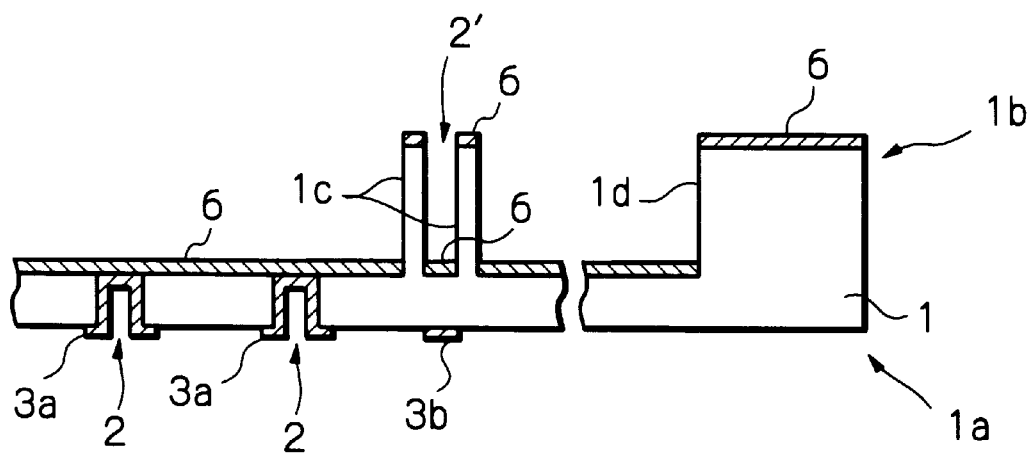
FIGS. 9 and 10 are also cross-sectional views for explaining the first embodiment of the present invention.

Next, referring to FIG. 9, a plating path layer 6 made of An/Ti is deposited on the back surface 1b of the semiconductor wafer 1 by an evaporating process. In this case, the plating path layer 6 is electrically connected to the surface electrodes 3a as well as the connection electrode 3b.

Note that the walls 1c are made a little lower than the wall 1d due to the dry etching process. Even in this case, when an anisotropic evaporation method is used for the plating path layer 6, the plating path layer 6 is hardly forked on the sidewalls of the walls 1c, so that the plating path layer 6 for the pellets P is electrically isolated from the plating path layer 6 for the etching cut portions.

Figure 10:
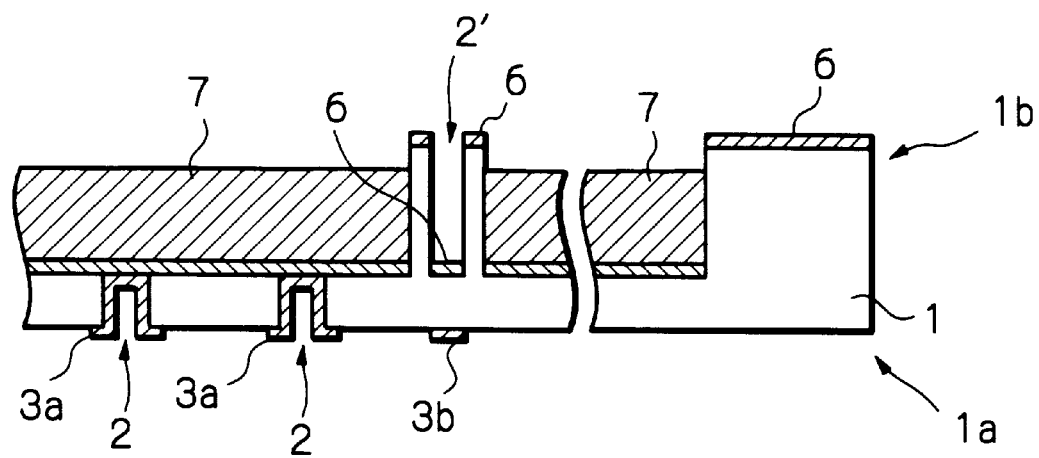

Next, referring to FIG. 10, a PHS metal layer 7 made of Au is electroplated on the plating path layer 6 by applying a negative voltage to the plating path metal layer 6 through the surface electrode 3a and the connection electrode 3b and a positive voltage to an electrolytic bath (not show) of Au.

In this case, the PHS layer 7 is not electroplated on a part of the plating path layer 6 in the etching cut portions since the negative voltage is not applied thereto.

Finally, the pellets P are separated from each other by performing a dicing process or the like upon the semiconductor wafer 1 in the etching cut portions where the PHS metal layer 7 is not formed.

The width of the first portion of the photoresist pattern layer 4 is determined, so that the wall 1d of the semiconductor wafer 1 can support the entire semiconductor wafer 1. For example, this width is about 7 to 12 percent of the diameter of the semiconductor wafer 1, preferably, about 10 to 12 percent of the diameter of the semiconductor wafer 1. Also, the width of each stripe of the second portion of the photoresist pattern layer 4 is about 20 to 60 µm, preferably, about 40 to 60 µm. Note that the walls 1c can be arranged within the etching cut portions.

In the above-described first embodiment, since the walls 1c and 1d can serve as the supporting plate 102 of the prior art method, the introduction of contamination into the pellets P and the generation of marks or cracks in the pellets P are suppressed, which increases the manufacturing yield. Also, the supporting plate adhering step and the supporting plate separating step are unnecessary, which increases the productivity. Further, since the photoresist pattern layer 2a is formed on the front surface 1a of the semiconductor wafer 1, the alignment accuracy of the via holes 2 is improved. Therefore, it is possible to form more-fined via holes 2.

A second embodiment of the method for manufacturing a semiconductor device is explained next with reference to FIGS. 11A, 11B, 12A, 12B, 13A, 13B, 14A, 14B, 15A, 15B, 17, 17 and 18. FIGS. 11B, 12B, 13B and 14B are cross-sectional views taken along the lines XI—XI, XII—XII, XIII—XIII and XIV—XIV of FIGS. 11A, 12A 13A and 14A, 10 respectively.

Figure 11A:
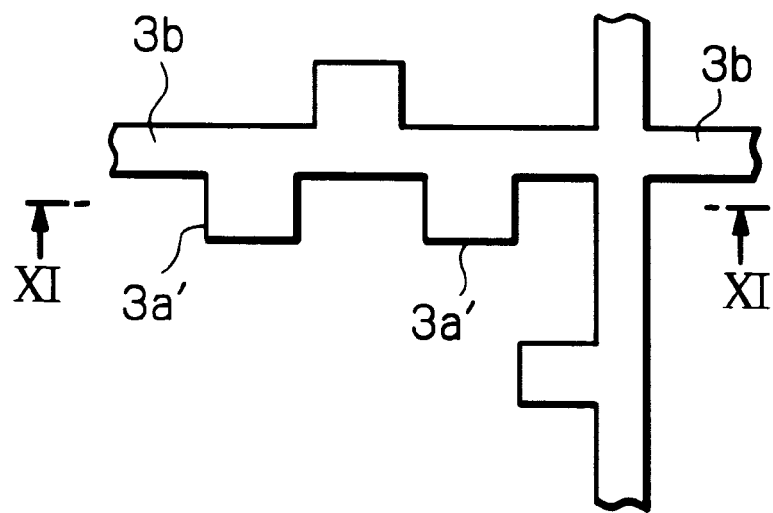
FIGS. 11A, 12A, 13A and 14A are plan views for explaining a second embodiment of the method for manufacturing a semiconductor device according to the present invention.
Figure 11B:
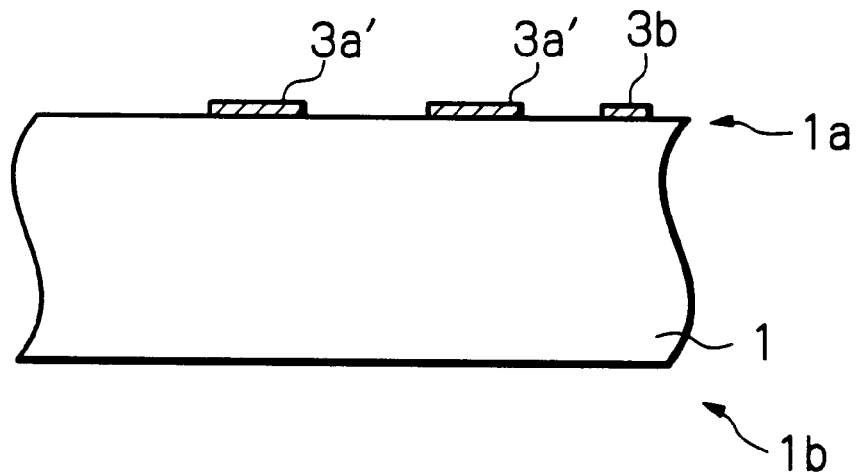
FIGS. 11B, 12B, 13B and 14B are cross-sectional views taken along the lines XI—XI, XII—XII, XIII—XIII and XIV—XIV of FIG. 11A, 12A, 13A and 14A, respectively.

First, referring to FIGS. 11A and 11B, a 4-inch diameter, about 600 µm thick semiconductor wafer 1 made of GaAs is prepared. In this case, transistors are formed on a front surface 1a of the semiconductor wafer 1 in advance, while no transistors are formed on a back surface of the semiconductor wafer 1. Then, a metal layer 3 (not shown) is deposited by an evaporating process or a sputtering process, and then, the metal layer is patterned by a photolithography and etching process. As a result, surface electrodes 3a' and a connection electrode 3b for connecting the surface electrodes 3a are formed on the front surface 1a of the semiconductor wafer 1. Then, the back surface 1b of the semiconductor wafer 1 is polished, so that its thickness becomes about 300 µm.

Figure 12A:
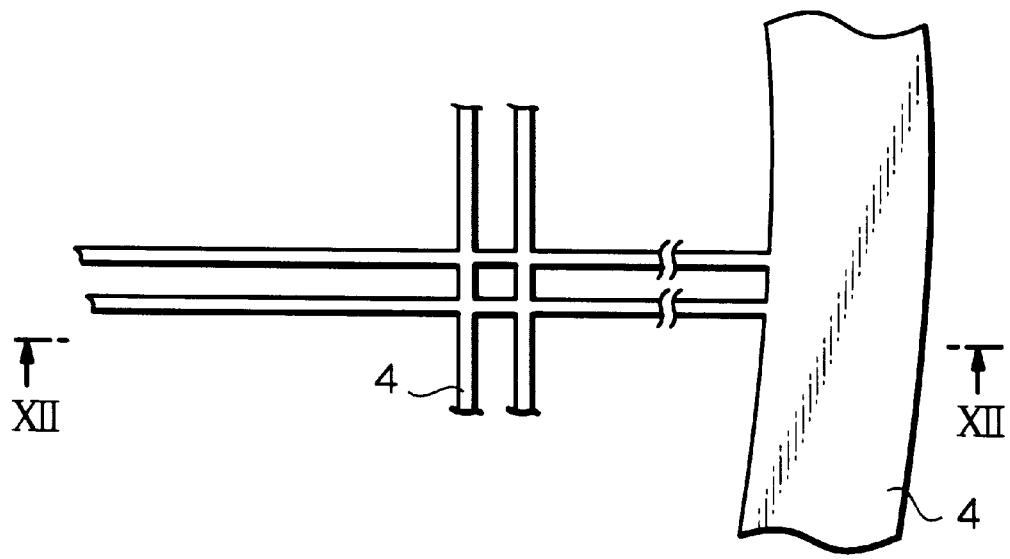
Figure 12B:
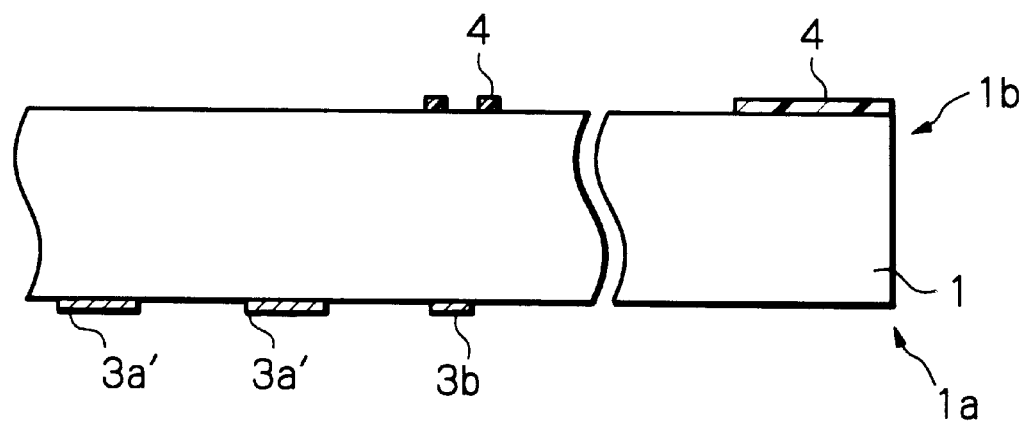

Next, referring to FIGS. 12A and 12B, in the same way as in FIGS. 6A and 6B, after the semiconductor wafer 1 is reversed, a photoresist pattern layer 4 is formed on the back surface 1b of the semiconductor wafer 1 by using a photolithography process. In this case, as illustrated in FIG. 7 which illustrates the entire back surface 1b of the semiconductor wafer 1, the photoresist pattern layer 4 is constructed by a first portion having a width of about 5 mm around the semiconductor wafer 1, and a second portion formed by two stripes each having a width of about 50 µm. The two stripes sandwich one etching cut portion. Note that FIGS. 12A and 12B correspond to an area indicated by X in FIG. 7.

Figure 13A:
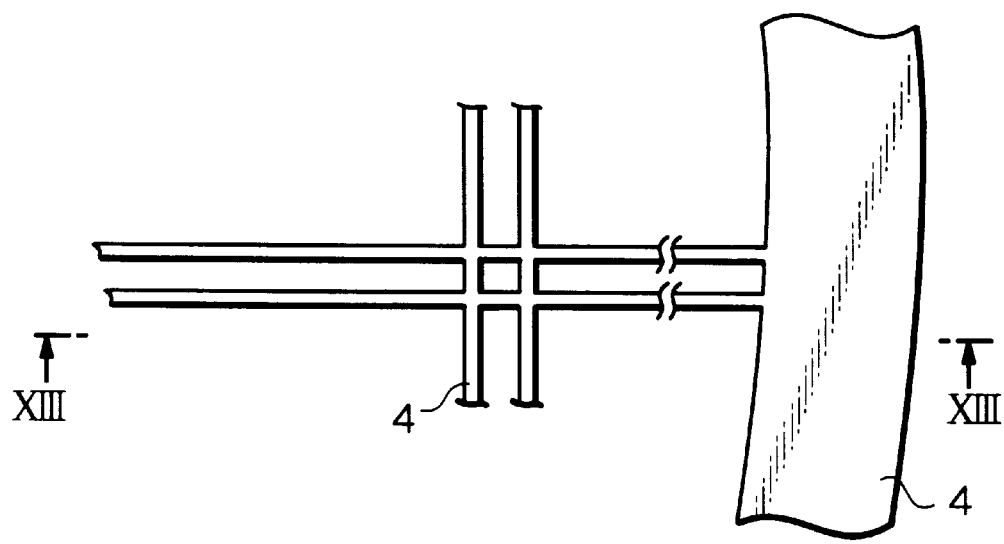
Figure 13B:
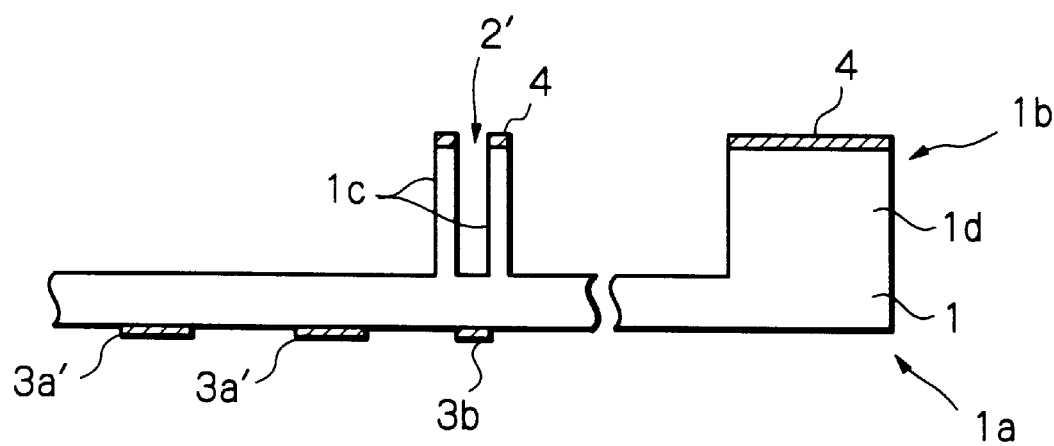

Next, referring to FIGS. 13A and 13B, in the same way as in FIGS. 8A and 8B, the semiconductor wafer 1 is etched by a dry etching process using the photoresist pattern layer 4 as a most. Thus, the semiconductor wafer 1 is made thin except for the etching cut portions and the periphery portion. That is, walls 1c remain having a through hole 2' therebetween on both sides of the etching cut portions, and a wall 1d remains in the periphery portion of the semiconductor wafer 1. Then, the photoresist pattrn layer 4 is removed.

Figure 14A:
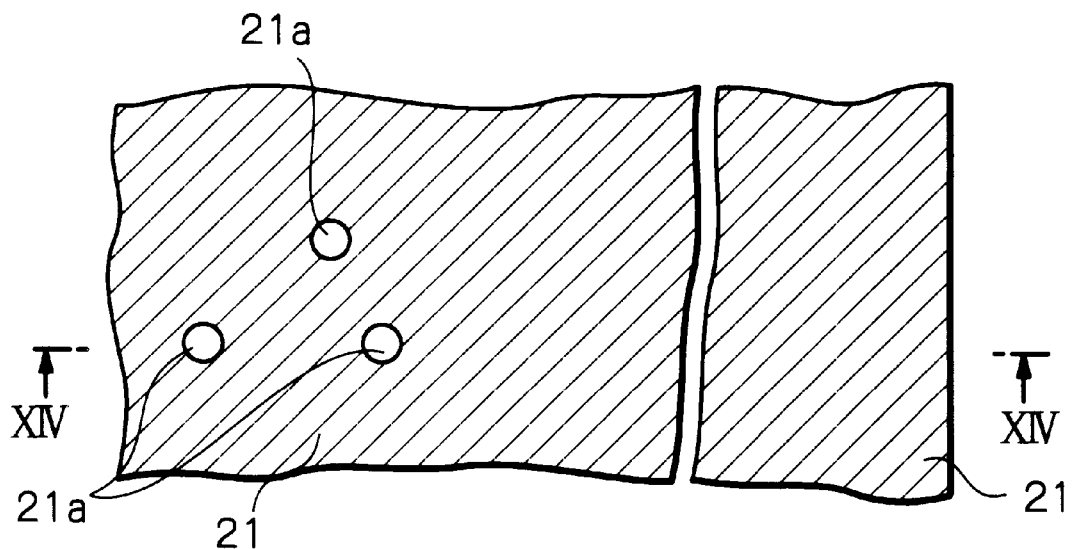
Figure 14B:
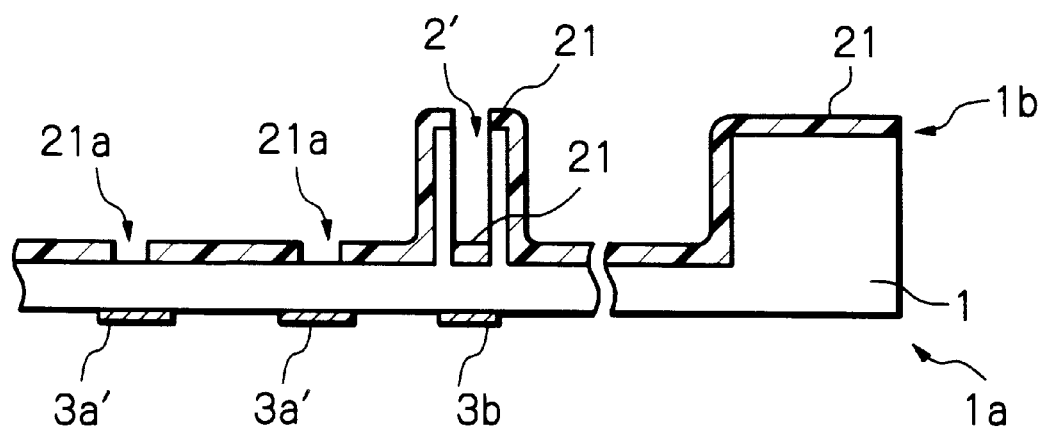

Next, referring to FIGS. 14A and 14B, a photoresist pattern layer 21 is formed on the back surface 1b of the semiconductor wafer 1 by a photolithography process. In this case, the photoresist pattern layer 21 has openings 21a for forming via holes.

Figure 15:
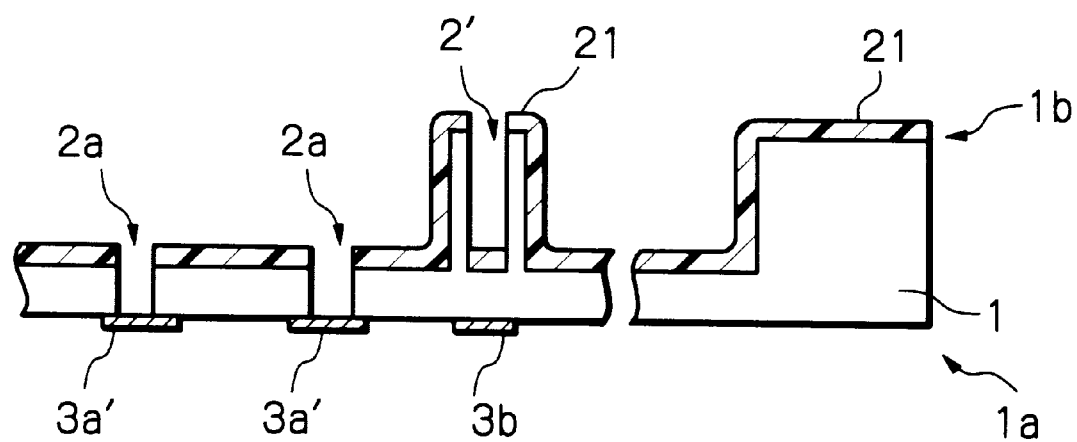
FIGS. 15, 16 and 17 are also cross-sectional views for explaining the second embodiment of-the present invention.

Next, referring to FIG. 15, the semiconductor wafer 1 is etched by a dry etching process using the photoresist pattern layer 21 as a mask. As a result, via holes 2 for exposing the surface electrodes 3a'. In this case, the width of the via holes 2a is smaller than that of the surface electrodes 3a', Then, the photoresist pattern layer 21 is removed.

Figure 16:
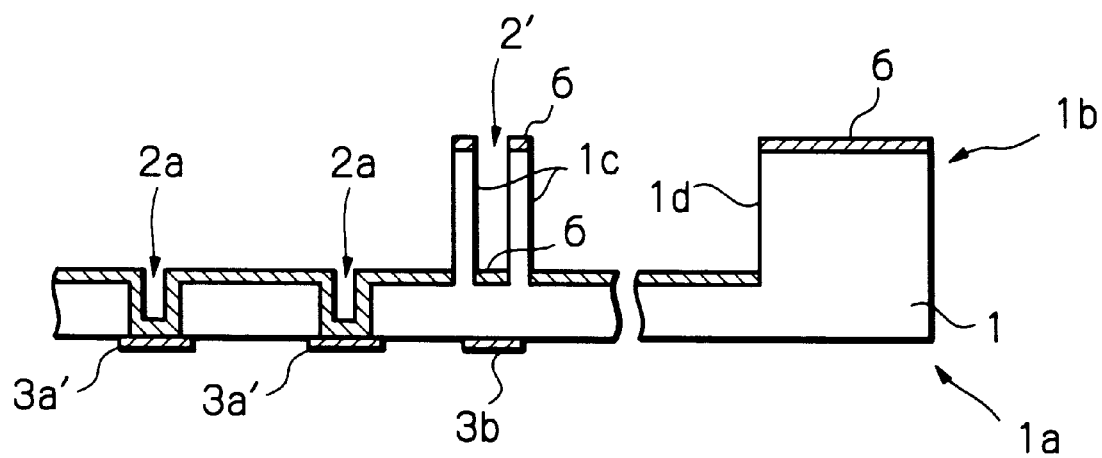

Next, referring to FIG. 16, in the same way as in FIG. 9, a plating path layer 6 made of Au/Ti is deposited on the back surface 1b of the semiconductor wafer 1 by an evaporating process.

Note that the sidewalls of the via holes 2a are a little sloped by the dry etching process, and therefore, the plating path layer 6 is also deposited on the sidewalls of the via holes 2a. As a result, the plating path layer 6 is electrically connected to the surface electrodes 3a' as well as the connection electrode 3b.

On the other hand, the walls 1c are made a little lower than the wall 1d due to the dry etching process. Even in this case, when an anisotropy evaporation method is used for the plating path layer 6, the plating path layer 6 is hardly formed on the sidewalls of the walls 1c, so that the plating path layer 6 for the pellets P is electrically isolated from the plating path layer 6 for the etching cut portions.

Figure 17:
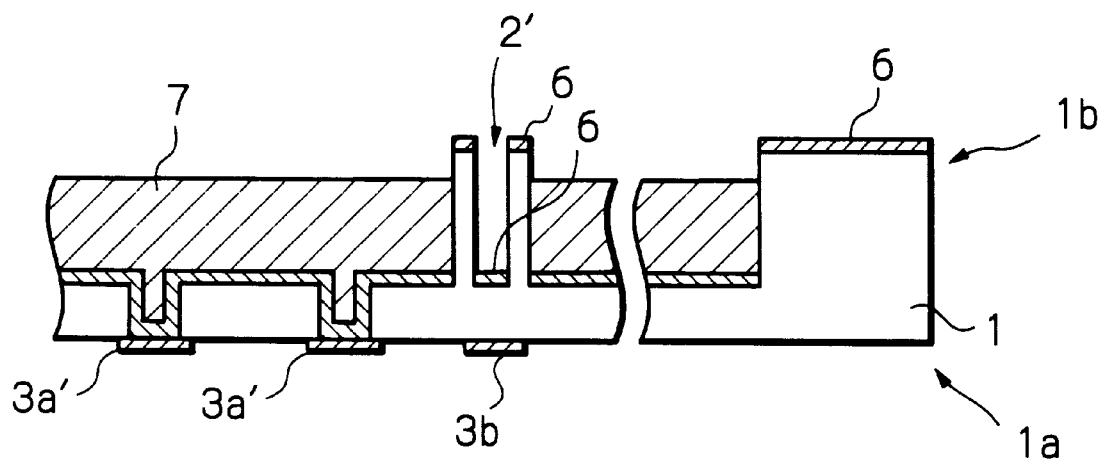

Next, referring to FIG. 17, in the same way as in FIG. 10, a PHS metal layer 7 made of Au is electroplated on the plating path layer 6 by applying a negative voltage to the plating path metal layer 6 through the surface electode 3a' and the connection electrode 3b and a positive voltage to an electrolytic bath (not shown) of Au. In this case, the PHS layer 7 is not electroplated on a part of the plating path layer 6 in the etching cut portions since the negative voltage is not applied thereto.

Finally, the pellets P are separated from each other by performing a dicing process or the like upon the semiconductor wafer 1 in the etching cut portions where the PHS metal layer 7 is not formed.

Also, in the second embodiment, the width of the first portion of the photoresist pattern layer 4 is determined, so that the wall 1d of the semiconductor wafer 1 can support the entire semiconductor wafer 1. For example, this width is about 7 to 12 percent of the diameter of the semiconductor wafer 1, preferably, about 10 to 12 percent of the diameter of the semiconductor wafer 1. Also, the width of each stripe of the second portion of the photoresist pattern layer 4 is about 20 to 60 µm, preferably, about 40 to 60 µm. Note that the walls 1c can be arranged within the etching cut portions.

Also, in the above-described second embodiment, since the walls 1c and 1d can serve as the supporting plate 102 of the prior art method, the introduction of contamination into the pellets P and the generation of marks or cracks in the pellets P are suppressed, which increases the manufacturing yield. Also, the supporting plate adhering step and the supporting plate separating step are unnecessary, which increases the productivity. Further, even if the photoresist pattern layer 21 is formed on the back surface 1b of the semiconductor wafer 1, since the thickness of the semiconductor wafer 1 is made thin, the alignment accuracy of the via holes 2 is improved. Therefore, it is possible to form more-fined via holes 2.

In the above-mentioned embodiments, although the semiconductor wafer 1 is made of GaAs, the present invention can be applied to semiconductor wafers made of Si, InP or their mixed crystal.

As explained hereinabove, according to the present invention, the manufacturing yield and the productivity can be increased. In addition, the alignment accuracy of the via holes can be improved.

What is claimed is:

1. A method for manufacturing a semiconductor device, comprising the steps of:

preparing a semiconductor wafer having a front surface with semiconductor elements and a back surface with no semiconductor elements; and etching the back surface of said semiconductor wafer to form a first wall on the back surface of said semiconductor wafer in a periphery of said semiconductor wafer and a second wall of a grid configuration constructed by two stripes on the back surface of said semiconductor wafer within said first wall, said second wall being connected to said first wall.

2. The method as set forth in claim 1, further comprising the steps of:

depositing a plating path layer on the back surface of said semiconductor wafer except for said second wall;

electroplating a plated heat sink metal layer on said plating path layer except for said second wall by applying a voltage to said plating path layer.

3. The method as set forth in claim 2, further comprising the steps of:

forming via holes in said semiconductor wafer on the front surface; and forming surface electrodes within said via holes of said semiconductor wafer, said semiconductor wafer etching step etching said semiconductor wafer to expose said surface electrodes from the back surface of said semiconductor wafer, said plated heat sink electroplating step applying said voltage to said surface electrodes.

4. The method as set forth 3, wherein said surface electrode forming step forms a connection electrode connected to said surface electrodes on the front surface of said semiconductor wafer.

5. The method as set forth in claim 2, further comprising the steps of:

forming surface electrodes on the front surface of said semiconductor wafer before said semiconductor wafer is etched; and forming via holes in said semiconductor wafer on the back surface to expose said surface electrodes before said plating path layer is deposited, said plated heat sink electroplating step applying said voltage to said surface electrodes.

6. The method as set forth 5, wherein said surface electrode forming step forms a connection electrode connected to said surface electrodes on the front surface of said semiconductor wafer.

7. A method for manufacturing a semiconductor device, comprising the steps of:

preparing a semiconductor wafer having a front surface with transistor elements and a back surface with no transistor elements;

forming via holes in pellet forming areas of said semiconductor wafer on the front surface of said semiconductor wafer;

forming surface electrodes within said via holes and a connection electrode in pellet dividing areas of said semiconductor wafer on the front surface of said semiconductor wafer, said connection electrode being connected to said surface electrode;

forming a photoresist pattern layer on the back surface of said semiconductor wafer, said photoresist layer having a first portion on a periphery of said semiconductor wafer and a second portion of a grid configuration constructed by two stripes corresponding to said pellet dividing areas;

etching said semiconductor wafer by using said photoresist pattern layer as a mask to expose said surface electrodes from the back surface of said semiconductor wafer;

depositing a plating path layer connected to said surface electrodes on the back surface of said semiconductor wafer after said semiconductor wafer is etched; and depositing a plated beat sink metal layer on said plating path layer except for said pellet dividing areas by applying a voltage to said connection electrode.

8. A method for Manufacturing a semiconductor device, comprising the steps of:

preparing a semiconductor wafer having a front surface with transistor elements and a back surface with no transistor elements;

forming surface electrodes in pellet forming areas of said semiconductor wafer and a connection electrode in pellet dividing areas of said semiconductor wafer on the front surface of said semiconductor wafer, said connection electrode being connected to said surface electrods;

forming a first photoresist pattern layer on the back surface of said semiconductor wafer, said first photoresist layer having a first portion on a periphery of said semiconductor wafer and a second portion of a grid configuration constructed by two stripes corresponding to said pellet dividing areas;

etching said semiconductor wafer by using said first photoresist pattern layer as a mask;

forming a second photoresist pattern layer on the back surface of said semiconductor wafer after said semiconductor wafer is etched using said first photoresist pattern layer as a mask, said second photoresist pattern layer having openings corresponding to said surface electrodes;

etching said semiconductor wafer by using said second photoresist pattern layer as a mask to expose said surface electrodes from the back surface of said semiconductor wafer;

depositing a plating path layer connected to said surface electrodes on the back surface of said semiconductor wafer after said semiconductor wafer is etched using said second photoresist pattern layer; and depositing a plated heat sink metal layer on said plating path layer except for said pellet dividing areas by applying a voltage to said connection electrode.

* * * * *